(12) United States Patent
Kamiya (10) Patent No.: US 9,343,630 B2
(45) Date of Patent: May 17, 2016

(54) SEMICONDUCTOR LIGHT EMITTING ELEMENT

(75) Inventor: Masao Kamiya, Aichi-ken (JP)

(73) Assignee: Toyoda Gosei Co., Ltd., Kiyosu-shi, Aichi-ken (JP)

( * ) Notice: Subject to any disclaimer, the term of this patent is extended or adjusted under 35 U.S.C. 154(b) by 397 days.

(21) Appl. No.: 12/659,566

(22) Filed: Mar. 12, 2010

(65) Prior Publication Data

US 2010/0237381 A1   Sep. 23, 2010

(30) Foreign Application Priority Data

Mar. 23, 2009   (JP) ................................ 2009-070322

(51) Int. Cl.
*H01L 33/00* (2010.01)
*H01L 33/42* (2010.01)
*H01L 33/38* (2010.01)
*H01L 33/20* (2010.01)

(52) U.S. Cl.
CPC .............. *H01L 33/42* (2013.01); *H01L 33/382* (2013.01); *H01L 33/20* (2013.01)

(58) Field of Classification Search
CPC ........ H01L 33/20; H01L 33/42; H01L 33/382
USPC ......... 257/79, 99, E33.01, E33.055, E33.062, 257/E33.063, E33.064, E33.065
See application file for complete search history.

(56) References Cited

U.S. PATENT DOCUMENTS 5,696,389 A      12/1997  Ishikawa et al.
7,084,432 B2 *   8/2006  Kachi et al. ..................... 257/81
7,429,755 B2 *   9/2008  Hsu ................................. 257/81

(Continued)

FOREIGN PATENT DOCUMENTS

JP    56-126986 A    10/1981
JP    4-103666       9/1992

(Continued)

OTHER PUBLICATIONS

Kim et al. WO 2008/038842. Published Apr. 3, 2008. H01L 33/00. 13 pages.*
Japanese Office Action dated Aug. 28, 2012 with English Translation.
Japanese Office Action dated Feb. 19, 2013 with English Translation.
Japanese Office Action dated Dec. 24, 2013, with partial English translation.

*Primary Examiner* — Ori Nadav
(74) *Attorney, Agent, or Firm* — McGinn IP Law Group, PLLC (57) ABSTRACT

A semiconductor light emitting element includes a semiconductor laminated body comprising a first conductivity type layer, a light emitting layer and a second conductivity type layer in this order from a lower side, a first electrode formed on the first conductivity type layer, and a second electrode comprising a transparent electrode formed on the second conductivity type layer and an auxiliary electrode formed on the transparent electrode, the transparent electrode comprising an oxide and having sheet resistance smaller than that of the second conductivity type layer and the auxiliary electrode comprising metal and having sheet resistance smaller than that of the transparent electrode, wherein the auxiliary electrode has, in a planar view, a linear surrounding portion surrounding the first electrode and a pad portion formed outside the surrounding portion for connecting a wire and the surrounding portion has a plurality of shortest-distance portions, in which a plan view distance from the first electrode is minimum, in a circumferential direction.

11 Claims, 7 Drawing Sheets

(56) References Cited

U.S. PATENT DOCUMENTS

| | | | |
|---|---|---|---|
| 8,076,688 B2 * | 12/2011 | Kim et al. | 257/98 |
| 2002/0130327 A1 * | 9/2002 | Wu et al. | 257/80 |
| 2003/0107053 A1 | 6/2003 | Uemura et al. | |
| 2004/0232454 A1 | 11/2004 | Uemura et al. | |
| 2005/0001225 A1 * | 1/2005 | Yoshimura et al. | 257/98 |
| 2005/0156189 A1 | 7/2005 | Deguchi et al. | |

FOREIGN PATENT DOCUMENTS

| | | |
|---|---|---|
| JP | 7-254732 A | 10/1995 |
| JP | 10-163531 A | 6/1998 |
| JP | 10-209496 A | 8/1998 |
| JP | 2001-308380 A | 11/2001 |
| JP | 2001-345480 A | 12/2001 |
| JP | 2003-069074 A | 3/2003 |
| JP | 2008-159957 A | 7/2008 |
| JP | 2008-227109 A | 9/2008 |
| JP | 2009-059969 A | 3/2009 |
| WO | WO 2005/069388 A1 | 7/2005 |

* cited by examiner

SEMICONDUCTOR LIGHT EMITTING ELEMENT

The present application is based on Japanese Patent Application No. 2009-070322 filed on Mar. 23, 2009, the entire contents of which are incorporated herein by reference.

BACKGROUND OF THE INVENTION

1. Field of the Invention

The invention relates to a semiconductor light emitting element provided with a semiconductor laminated body which has an n-type layer, a light emitting layer and a p-type layer in this order from a lower side.

2. Related Art

As this type of semiconductor light emitting element, a conventional blue light-emitting device has been proposed in which an n-type GaN layer and an i-type GaN layer are sequentially laminated on a sapphire substrate and an electrode on the n-type GaN layer is surrounded by an electrode on the i-type GaN layer (e.g., see JP-U 4-103666). In addition, a light emitting diode has been also proposed in which an n-type cladding layer formed of InGaAlP, an active layer formed of InGaAlP and a p-type cladding layer formed of InGaAlP are sequentially laminated on a GaAs substrate and an n-side electrode formed of AuGe/Au on the n-type InGaAlP layer is surrounded by a p-side electrode formed of AuZn/Au on the p-type InGaAlP layer (e.g., see JP-A 7-254732).

However, in the semiconductor light emitting elements described in JP-U 4-103666 and JP-A 7-254732, since the electrode on the i-type GaN layer or on the p-type cladding layer is formed of metal, there is a problem that light extraction efficiency is not good due to light blocking action by the electrode.

THE SUMMARY OF THE INVENTION

The invention is made in view of the above-mentioned circumstances, and it is an object of the invention to provide a semiconductor light emitting element in which light extraction efficiency of an element can be improved without impairing diffusivity of electric current in the semiconductor light emitting element.

According to one embodiment of the invention, a semiconductor light emitting element, comprises:

a semiconductor laminated body comprising a first conductivity type layer, a light emitting layer and a second conductivity type layer in this order from a lower side;

a first electrode formed on the first conductivity type layer; and a second electrode comprising a transparent electrode formed on the second conductivity type layer and an auxiliary electrode formed on the transparent electrode, the transparent electrode comprising an oxide and having sheet resistance smaller than that of the second conductivity type layer, and the auxiliary electrode comprising metal and having sheet resistance smaller than that of the transparent electrode, wherein the auxiliary electrode has, in a planar view, a linear surrounding portion surrounding the first electrode and a pad portion formed outside the surrounding portion for connecting a wire; and the surrounding portion has a plurality of shortest-distance portions, in which a plan view distance from the first electrode is minimum, in a circumferential direction.

In this semiconductor light emitting element, the current flows in the first conductivity type layer, the light emitting layer and the second conductivity type layer when the voltage is applied to the first electrode and the second electrode, and the light is radiated from the light emitting layer by recombination of electron and hole. Here, since the sheet resistance of the auxiliary electrode is smaller than that of the transparent electrode in the second electrode, the current preferentially flows through a contact portion of the transparent electrode with the auxiliary electrode. Since the auxiliary electrode has the surrounding portion surrounding the first electrode in a planar view, and in addition, the surrounding portion has the plural shortest-distance portions in which a distance from the first electrode is minimum, the current is uniformly dispersed between the auxiliary electrode and the first electrode. As a result, the light can be emitted from a relatively large area at the light emitting layer when the voltage is applied. In addition, the exit of the light to the outside is not disturbed by the surrounding portion and it is possible to minimize the decrease in the light extraction efficiency due to the auxiliary electrode.

In the above embodiment, the transparent electrode may have sheet resistance larger than that of the first conductivity type layer.

In this semiconductor light emitting element, since the sheet resistance of the transparent electrode is larger than that of the first conductivity type layer, light emission is focused at the vicinity of the auxiliary electrode in the light emitting layer in a planar view specifically when flowing a large current. Here, since the auxiliary electrode is formed so as to surround the first electrode, an area in the light emitting layer where the current is focused can be enlarged compared with the case where the sheet resistance of the transparent electrode is smaller than that of the first conductivity type layer. In addition, it is possible to prevent excess current crowding and disperse the current.

In the above embodiment, the first electrode may be circularly formed in a planar view.

In the above embodiment, in a planar view, the surrounding portion may be integrally formed with an end portion of the pad portion on the first electrode side, and may have an arcuate arc-shaped zone that is concentric with the first electrode.

In the above embodiment, in a planar view, the surrounding portion may be formed in a circumferential shape that is concentric with the first electrode.

POINTS OF THE INVENTION

In the semiconductor light emitting element of one embodiment of the invention, light extraction efficiency of an element can be improved without impairing diffusivity of electric current in the semiconductor light emitting element.

BRIEF DESCRIPTION OF THE DRAWINGS

Next, the present invention will be explained in more detail in conjunction with appended drawings, wherein.

DESCRIPTION OF THE PREFERRED EMBODIMENTS

Figure 1:
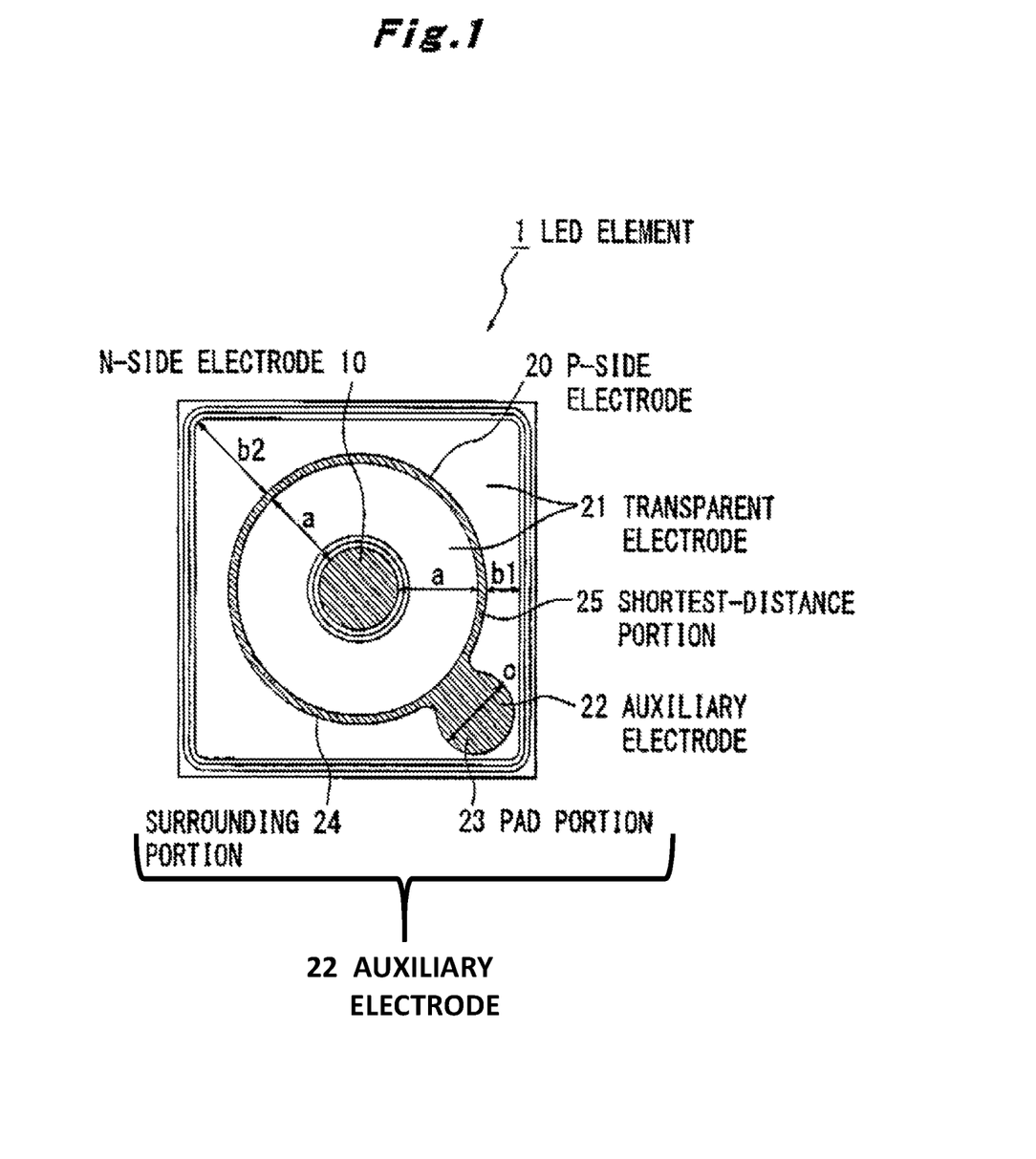
FIG. 1 is a schematic plan view showing a LED element in a preferred embodiment of the present invention.
Figure 2:
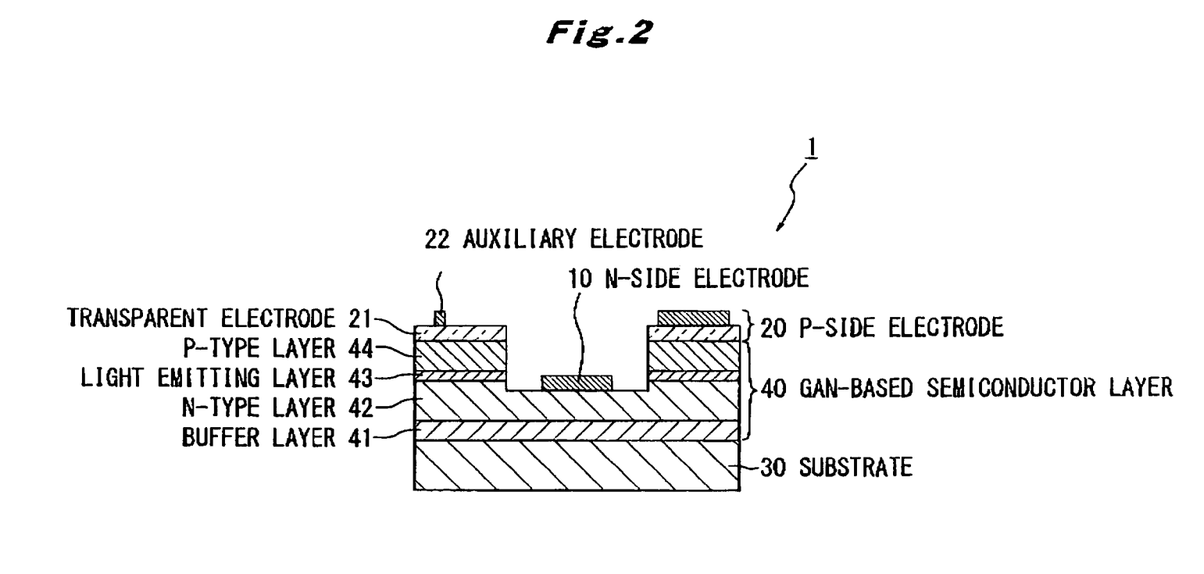
FIG. 2 is a schematic cross sectional view showing the LED element.

FIGS. 1 and 2 show the embodiment of the invention. FIG. 1 is a schematic plan view showing a LED element in an embodiment of the invention and FIG. 2 is a schematic cross sectional view showing the LED element.

As shown in FIG. 1, a LED element 1 is a face-up type in which an n-side electrode 10 and a p-side electrode 20 are formed on an upper surface side. In a planar view, the n-side electrode 10 is formed in the middle of the upper surface of the LED element 1 and the p-side electrode 20 is formed so as to surround the n-side electrode 10. In the present embodiment, the LED element 1 is formed having a substantially square shape in a planar view, the n-side electrode 10 is circularly formed in a region of the LED element 1 on the middle side, and the p-side electrode 20 is formed in a region of the LED element 1 on an outer edge side.

As shown in FIG. 2, the LED element 1 includes a substrate 30 formed of sapphire and a GaN-based semiconductor layer 40 which is formed on the substrate 30 and is represented by a formula of $In_xAl_yGa_{1-x-y}N$ ($0 \le x \le 1$, $0 \le y \le 1$, $0 \le x+y \le 1$). The GaN-based semiconductor layer 40 as a semiconductor laminated body has a buffer layer 41 formed on the substrate 30, an n-type layer 42 as a first conductivity type layer formed on the buffer layer 41, a light emitting layer 43 having a multi-quantum well structure formed on the n-type layer 42 and a p-type layer 44 as a second conductivity type layer formed on the light emitting layer 43, in this order from a lower side.

The buffer layer 41 is formed of, e.g., AlN. Meanwhile, the n-type layer 42 can be composed of, e.g., an n-type contact layer formed of Si-doped GaN and an n-type cladding layer formed of Si-doped AlGaN. In addition, a non-doped GaN layer may be formed between the buffer layer 41 and the n-type layer 42.

The light emitting layer 43 can be configured by laminating a predetermined number of pairs of, e.g., a well layer formed of InGaN and a barrier layer formed of non-doped GaN. Meanwhile, the p-type layer 44 can be composed of a p-type cladding layer formed of Mg-doped AlGaN and a p-type contact layer formed of Mg-doped GaN.

At a center portion of the GaN-based semiconductor layer 40 in a planar view, the n-side electrode 10 as a first electrode is formed on the n-type layer 42 which is exposed by excavation by, e.g., etching until exposure thereof. In the present embodiment, the GaN-based semiconductor layer 40 is circularly excavated in a planar view. Meanwhile, the p-side electrode 20 as a second electrode has a transparent electrode 21 formed on the p-type layer 44 and a metallic auxiliary electrode 22 formed on the transparent electrode 21.

The n-side electrode 10 can be composed of, e.g., a first layer formed of V and a second layer formed of Al. The transparent electrode 21 is formed of an oxide and can be formed of, e.g., indium tin oxide (ITO). Alternatively, the transparent electrode 21 can be also formed of indium gallium oxide (IGO), indium zinc oxide (IZO), indium cerium oxide (ICO), tin oxide (MESA) or zinc oxide, etc. Meanwhile, the auxiliary electrode 22 is formed of metal, and can be composed of a first layer formed of Ni and a second layer formed of Au.

As shown in FIG. 1, in the present embodiment, the transparent electrode 21 is formed on the substantially entire surface on the p-type layer 44 except an outer edge portion on the p-type layer 44. Meanwhile, the auxiliary electrode 22 has, in a planar view, a pad portion 23 formed in the vicinity of one corner (a right bottom corner in FIG. 1) of the LED element 1, and a linear surrounding portion 24 which is continuously formed from the pad portion 23 and surrounds the n-side electrode 10.

In the present embodiment, the pad portion 23 is formed in a circular shape and the surrounding portion 24 is formed in an arc shape concentric with the n-side electrode 10. The surrounding portion 24 is integrally formed with an end portion of the pad portion 23 on the n-side electrode 10 side in a planar view, and has an arcuate arc-shaped zone which is concentric with the n-side electrode 10. The pad portion 23 is formed outside the surrounding portion 24 and functions as an external power supply portion to which a wire connected, and the surrounding portion 24 has a function of dispersing the current which flows to the GaN-based semiconductor layer 40.

When taking the current dispersion into consideration, the surrounding portion 24 needs to possess plural shortest-distance portions 25, in which a plan view distance from the n-side electrode 10 is minimum, in a circumferential direction. In the present embodiment, the surrounding portion 24 has a constant distance from the n-side electrode 10 throughout the circumferential direction, and has plural shortest-distance portions 25 throughout the circumferential direction. A width dimension of the surrounding portion 24 is arbitrary, and is 10 μm in the present embodiment.

In addition, in the present embodiment, the sheet resistance of the transparent electrode 21 is larger than that of the n-type layer 42. Then, the sheet resistance of the transparent electrode 21 is smaller than that of the p-type layer 44, and the sheet resistance of the auxiliary electrode 22 is smaller than that of the transparent electrode 21.

In addition, when a distance from the n-side electrode 10 to the surrounding portion 24 is defined as a, a distance from an outer edge of the surrounding portion 24 to a side outer edge of the transparent electrode 21 is defined as b1, a distance from the outer edge of the surrounding portion 24 to a corner outer edge of the transparent electrode 21 is defined as b2 and a diameter of the pad portion 23 is defined as c as shown in FIG. 1, a>b1 as well as b2>c is desirable.

In the LED element 1 configured as described above, the current flows in the n-type layer 42, the light emitting layer 43 and the p-type layer 44 when the voltage is applied to the n-side electrode 10 and the p-side electrode 20, and the light with a predetermined wavelength is radiated from the light emitting layer 43 by recombination of electron and hole. In the present embodiment, blue light is radiated from the light emitting layer 43.

Here, since the sheet resistance of the auxiliary electrode 22 is smaller than that of the transparent electrode 21 in the p-side electrode 20, the current preferentially flows through a contact portion of the transparent electrode 21 with the auxiliary electrode 22. Since the auxiliary electrode 22 has the surrounding portion 24 surrounding the n-side electrode 10 in a planar view, and in addition, the surrounding portion 24 has the plural shortest-distance portions 25 in which a distance from the n-side electrode 10 is minimum, the current is uniformly dispersed between the auxiliary electrode 22 and the n-side electrode 10. As a result, the light can be emitted from a relatively large area at the light emitting layer 43 when the voltage is applied.

Among the light radiated from the light emitting layer 43, a component thereof heading to the p-side electrode 20 permeates the transparent electrode 21 and exits outside the element. Here, since the surrounding portion 24 of the auxiliary electrode 22 is linearly formed, the exit of the light to the outside is not disturbed by the surrounding portion 24, and it is thus possible to minimize the decrease in the light extraction efficiency due to the auxiliary electrode 22.

In the present embodiment, since the n-side electrode 10 is in a circular shape and the surrounding portion 24 has a circumferential shape concentric therewith, a distance from the surrounding portion 24 to the n-side electrode 10 is equal throughout the circumferential direction and it is possible to disperse the current more uniformly by the surrounding portion 24 and the n-side electrode 10, hence, it is highly advantageous in practical use.

In addition, in the present embodiment, since the surrounding portion 24 of the auxiliary electrode 22 is formed in a circumferential shape from the end portion on the n-side electrode 10 side of the pad portion 23 formed at a corner so as to be concentric with the n-side electrode 10, it is possible to have a relatively large distance between the surrounding portion 24 and the n-side electrode 10. As a result, it is possible to form the surrounding portion 24 relatively distant from the n-side electrode 10, and the Light emitting layer 43 can emit the light more effectively.

Figure 3:
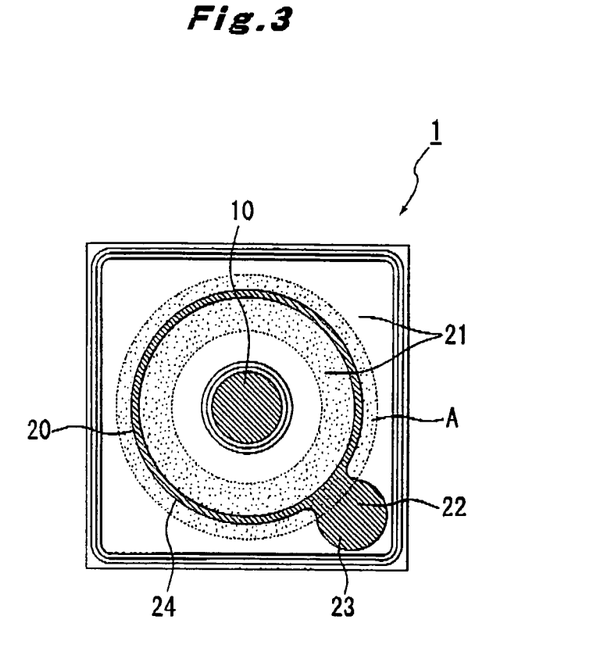
FIG. 3 is a schematic plan view showing a light emitting state of the LED element when sheet resistance of a transparent electrode is larger than that of an n-type layer.

In addition, since the sheet resistance of the transparent electrode 21 of the p-side electrode 20 is larger than that of the n-type layer 42, light emission is focused at the vicinity of the auxiliary electrode 22 in the light emitting layer 43 in a planar view as shown in FIG. 3 specifically when flowing a large current. A main emitting region of the light emitting layer 43 is shown as A in FIG. 3. Here, since the auxiliary electrode 22 is formed so as to surround the n-side electrode 10, an area in the light emitting layer 43 where the current is focused can be enlarged compared with the case where the sheet resistance of the transparent electrode 21 is smaller than that of the n-type layer 42. In addition, it is possible to prevent excess current crowding. As a result, even when the sheet resistance is different between the transparent electrode 21 and the n-type layer 42, the light emission in the light emitting layer 43 becomes uniform, which allows a relatively large amount of luminescence. In addition, since the current is relatively dispersed, it is easy to ensure reliability and electrostatic pressure resistance performance can be relatively high.

Figure 4:
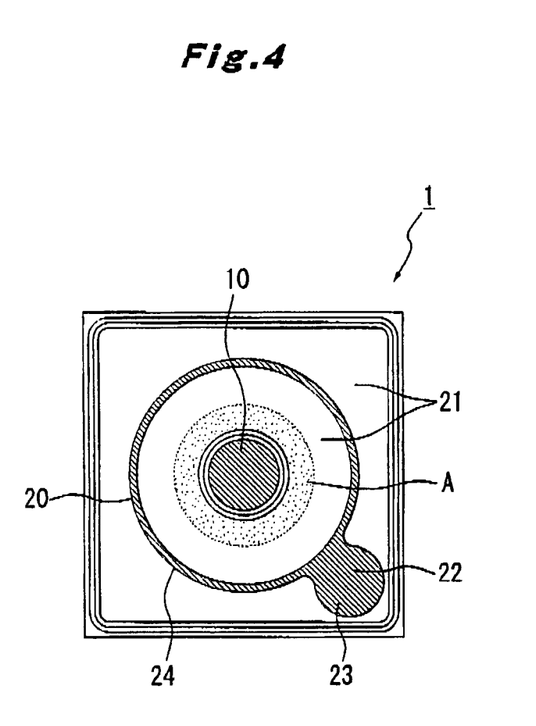
FIG. 4 is a schematic plan view showing a light emitting state of the LED element when sheet resistance of the transparent electrode is smaller than that of the n-type layer.

In contrast, as shown in FIG. 4, when the sheet resistance of the n-type layer 42 is larger than that of the transparent electrode 21 and the large current is flown, the light emission is focused on the n-side electrode 10 side. A main emitting region of the light emitting layer 43 is shown as A in FIG. 4. Also in this configuration, the amount of luminescence is large and the reliability as well as the electrostatic pressure resistance performance are high in the well-known LED element. However, the amount of luminescence is small compared with the case where the sheet resistance of the transparent electrode 21 is large, thus, the reliability is inferior and the electrostatic pressure resistance performance is low.

It is needless to say that the sheet resistance of the both are desirably equalized if the sheet resistance of the transparent electrode 21 can be controlled to be equal to that of the n-type layer 42, however, the manufacturing conditions, etc., must be strictly controlled, which makes the manufacturing cost of the LED element 1 extremely high. Therefore, by tolerating dispersion between the sheet resistance of the transparent electrode 21 and that of the n-type layer 42 and setting the sheet resistance of the transparent electrode 21 high taking the dispersion into consideration, it is possible to certainly obtain a relatively high performance LED element 1 at a low cost.

Figure 5:
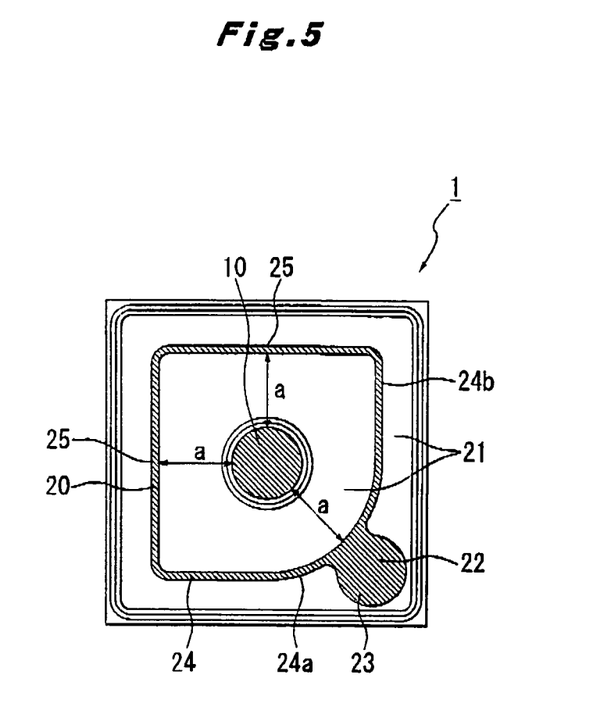
FIG. 5 is a schematic plan view showing a LED element in a modification.

Although it is shown that the surrounding portion 24 of the transparent electrode 21 is a circumferential shape in the above-mentioned embodiment, for example as shown in FIG. 5, the surrounding portion 24 may have the vicinity of the pad portion 23 as an arc-shaped zone 24a which is integrally formed with the end portion of the pad portion 23 on the n-side electrode 10 side, and a portion separated from the pad portion 23 as an outer edge zone 24b along the outer edge of the LED element 1. In this case, it is preferable that the shortest-distance portion 25 in which the distance from the n-side electrode 10 is minimum is formed in the outer edge zone 24b. Here, in the auxiliary electrode 22, a shape of the surrounding portion 24 is arbitrary as long as there are plural shortest-distance portions 25 in a circumferential direction. In the LED element 1 of FIG. 5, a distance a from the n-side electrode 10 in the arc-shaped zone 24a of the auxiliary electrode 22 is shortest, thus, the arc-shaped zone 24a is also the shortest-distance portion 25.

In addition, although it is shown that the n-side electrode 10 is circularly formed in a planar view in the above-mentioned embodiment, the n-side electrode 10 may be formed in a polygonal shape. In addition, although it is shown that the LED element 1 is formed in a substantially square shape in a planar view, it goes without saying that it may be, e.g., a substantial rectangular or other shapes as shown in FIGS. 6 and 7.

Figure 6:
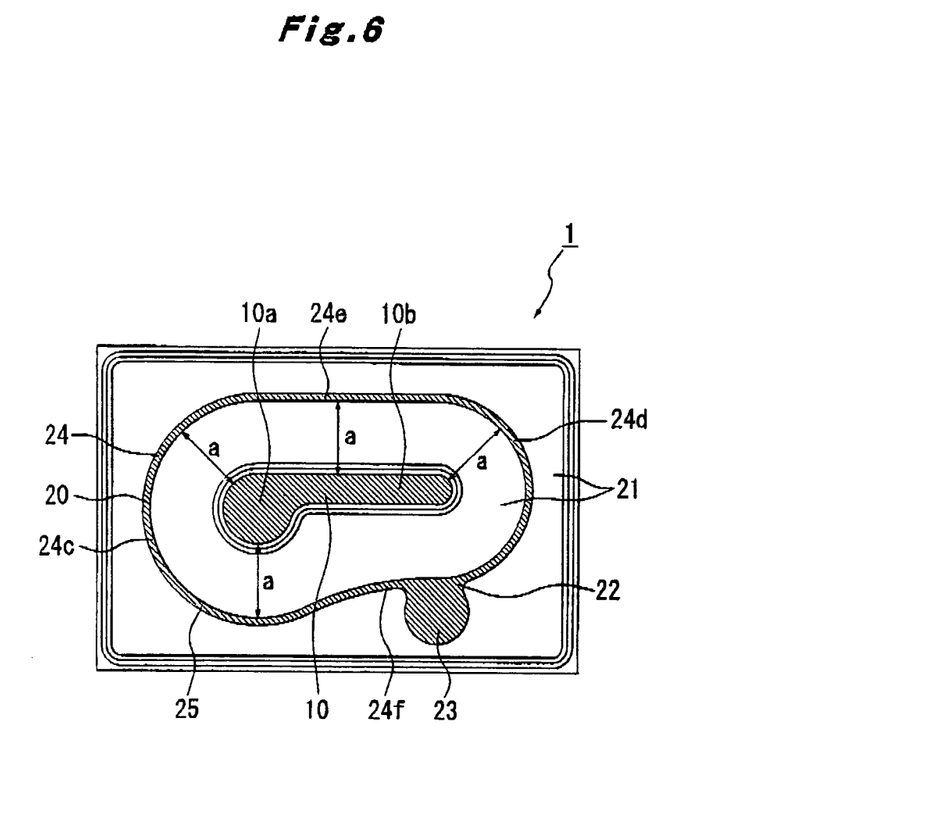
FIG. 6 is a schematic plan view showing a LED element in a modification.
Figure 7:
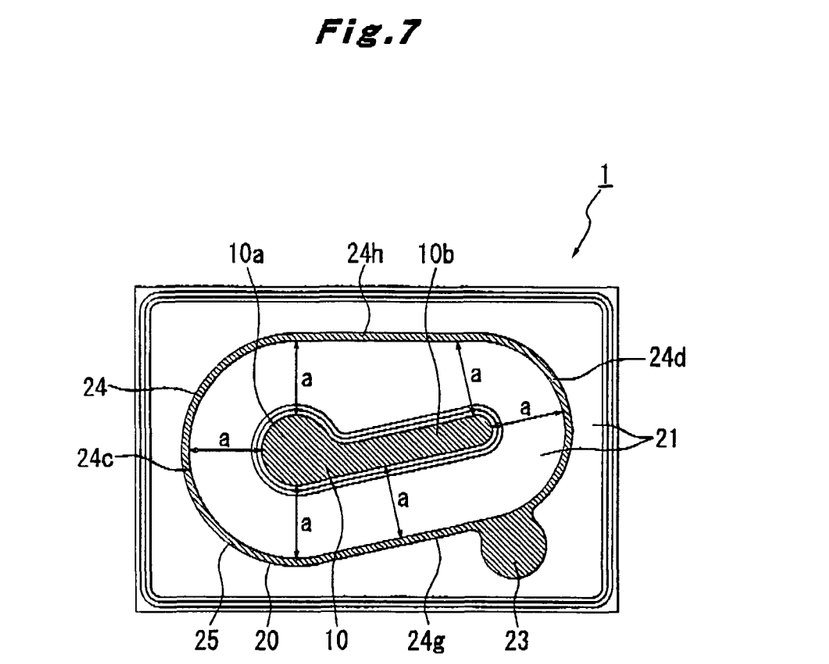
FIG. 7 is a schematic plan view showing a LED element in a modification.

Moreover, for example as shown in FIGS. 6 and 7, the n-side electrode 10 may have a main body 10a formed in a circular or polygonal shape, and an extending portion 10b which extends from the main body 10a in a predetermined direction. In FIGS. 6 and 7, the LED element 1 has a landscape rectangular shape in a planar view, the circular main body 10a is arranged near one side of the LED element 1 in a longitudinal direction, and the extending portion 10b extends in another direction. A width dimension of the extending portion 10b is formed shorter than the dimension of the main body 10a. In FIGS. 6 and 7, one outer edge of the extending portion 10b in a width direction is a tangent line of the circular main body 10a. Meanwhile, a tip of the extending portion 10b is formed in a semicircular shape. In FIGS. 6 and 7, the auxiliary electrode 22 has a first arc-shaped zone 24c having a constant distance from the n-side electrode 10 on one side in a planar view, and a second arc-shaped zone 24d having a constant distance from a tip of the extending portion 10b on another side in a planar view.

In the LED element 1 of FIG. 6, the extending portion 10b extends in parallel to a longitudinal side of the LED element 1. In addition to the first arc-shaped zone 24c and the second arc-shaped zone 24d, the auxiliary electrode 22 has a straight zone 24e and a curved zone 24f which connect each arc-shaped zone 24c and 24d. The straight zone 24e is formed along one outer edge of the extending portion 10b in a width direction and the curved zone 24f is formed in a curved line concave with respect to the n-side electrode 10. In this the LED element 1, the straight zone 24e is formed having a constant distance from the outer edge of the LED element 1 in a planar view. The pad portion 23 of the auxiliary electrode 22 is arranged outside the curved zone 24f. The distances a from the n-side electrode 10 in the first arc-shaped zone 24c, the second arc-shaped zone 24d and the straight zone 24e are formed equal, thus, these are the shortest-distance portion 25.

In the LED element 1 of FIG. 7, the extending portion 10b extends at a slant with respect to the longitudinal side of the LED element 1. In addition to the first arc-shaped zone 24c and the second arc-shaped zone 24d, the auxiliary electrode 22 has a first straight zone 24g and a second straight zone 24h which connect each arc-shaped zone 24c and 24d. The first straight zone 24g is formed along one outer edge of the extending portion 10b in a width direction and the second straight zone 24h is formed distant from the n-side electrode 10 compared with the first straight zone 24g. In this the LED element 1, the second straight zone 24h is formed having a constant distance from the outer edge of the LED element 1 in a planar view, and the first straight zone 24g is formed at a slant with respect to the outer edge of the LED element 1. The pad portion 23 of the auxiliary electrode 22 is arranged outside the first straight zone 24g. The distances a from the n-side electrode 10 in the first arc-shaped zone 24c, the second arc-shaped zone 24d and the first straight zone 24g are formed equal, thus, these are the shortest-distance portion 25.

In addition, although it is shown that the GaN-based semiconductor layer 40 is used as a semiconductor laminated body in the above-mentioned embodiment, it is possible to use a semiconductor material such as AlGaAs-base, GaAsP-base, GaP-base, ZnSe-base, or AlGaInP-base, etc. In addition, although it is shown that the n-type layer 42 is formed as a first conductivity type layer of the semiconductor laminated body and the p-type layer 44 is formed as a second conductivity type layer, it may be configures such that a p-type layer is used as the first conductivity type layer and an n-type layer is used as the second conductivity type layer, or that a layer having a conductivity type other than n-type and p-type is used.

In addition, although sapphire is used for the substrate 30 in the above-mentioned each embodiment, the substrate 30 may be formed of GaN, etc., and the material of the n-side electrode 10 or the auxiliary electrode 22, etc., can be arbitrarily changed, and other specific detailed structure, etc., can be, of course, appropriately changed.

Although the invention has been described with respect to the specific embodiment for complete and clear disclosure, the appended claims are not to be therefore limited but are to be construed as embodying all modifications and alternative constructions that may occur to one skilled in the art which fairly fall within the basic teaching herein set forth.

What is claimed is:

1. A semiconductor light emitting element, comprising:
   a semiconductor laminated body comprising a first conductivity type layer, a light emitting layer, and a second conductivity type layer, formed in this order;
   a first electrode formed on the first conductivity type layer; and
   a second electrode comprising a transparent electrode formed on the second conductivity type layer and an auxiliary electrode formed on the transparent electrode, the transparent electrode comprising an oxide and having a sheet resistance less than a sheet resistance of the second conductivity type layer, and the auxiliary electrode comprising a metal and having a sheet resistance less than said sheet resistance of the transparent electrode,
   wherein the auxiliary electrode comprises, in a planar view:
       a linear surrounding portion surrounding an entirety of the first electrode and comprising a circle which is concentric with the first electrode such that a distance between the linear surrounding portion and the first electrode is the same around the entirety of the first electrode, and a portion of the linear surrounding portion comprising an arc-shaped zone which is concave toward the first electrode; and
       a single pad portion comprising an innermost portion which is formed outside the linear surrounding portion and connected to an outer edge of the arc-shaped zone of the linear surrounding portion for connecting a wire,
   wherein the single pad portion comprises:
       a circular-shaped portion which is formed outside the linear surrounding portion; and
       a connecting portion which includes the innermost portion, and connects an innermost circumferential portion of the circular-shaped portion to the outer edge of the arc-shaped zone of the linear surrounding portion,
   wherein the pad portion is separated from the first electrode by the arc-shaped zone in a plan view, and
   wherein an entirety of a surface of the transparent electrode except for the linear surrounding portion and the single pad electrode, comprises a light-emitting surface.

2. The semiconductor light emitting element according to claim 1, wherein said sheet resistance of the transparent electrode is greater than a sheet resistance of the first conductivity type layer.

3. The semiconductor light emitting element according to claim 1, wherein the first electrode has a circular shape in a planar view.

4. The semiconductor light emitting element according to claim 3, wherein, in a planar view, the linear surrounding portion is integrally formed with the innermost portion of the pad portion.

5. The semiconductor light emitting element according to claim 1, wherein said first electrode is formed in a central portion of the first conductivity type layer.

6. The semiconductor light emitting element according to claim 1, wherein a>b1 and b2>c are satisfied where a is a distance from the first electrode to the linear surrounding portion, b1 is a distance from an outer edge of the linear surrounding portion to a side outer edge of the transparent electrode, b2 is a distance from the outer edge of the linear surrounding portion to a corner outer edge of the transparent electrode, and c is a diameter of the pad portion.

7. The semiconductor light emitting element according to claim 1, wherein the pad portion is formed so as not to be closer to the first electrode than the linear surrounding portion, and
   wherein a>b1 and b2>c are satisfied where a is a distance from the first electrode to the linear surrounding portion, b1 is a distance from an outer edge of the linear surrounding portion to a side outer edge of the transparent electrode, b2 is a distance from the outer edge of the linear surrounding portion to a corner outer edge of the transparent electrode, and c is a diameter of the pad portion.

8. The semiconductor light emitting element according to claim 1, wherein the semiconductor laminated body comprises a substantially square shape in a planar view, and the first electrode comprises a circular-shaped first electrode and is formed in a central portion of the semiconductor laminated body.

9. The semiconductor light emitting element according to claim 8, wherein the semiconductor laminated body comprises a circular-shaped trench portion formed in the central portion of the semiconductor laminated body, and a surface of the first conductivity type layer is exposed in the circular-shaped trench portion.

10. The semiconductor light emitting element according to claim 9, wherein the circular-shaped trench portion of the semiconductor laminated body is concentric with the circular-shaped first electrode.

11. The semiconductor light emitting element according to claim 1, wherein the transparent electrode comprises a first corner and a second corner opposite the first corner, and wherein the pad portion is formed between the linear surrounding portion and the first corner, and a distance from the second corner to the linear surrounding portion is greater than a diameter of the pad portion.

* * * * *